United States Patent [19]

Strasser

[11] Patent Number: 5,691,814
[45] Date of Patent: Nov. 25, 1997

[54] POSITION MEASURING INSTRUMENT

[75] Inventor: Erich Strasser, Trostberg, Germany

[73] Assignee: Dr. Johannes Heidenhain GmbH, Traunreut, Germany

[21] Appl. No.: 542,662

[22] Filed: Oct. 13, 1995

[30] Foreign Application Priority Data

Oct. 13, 1994 [DE] Germany ............ 44 36 546.2

[51] Int. Cl.$^6$ .................................. G01B 11/00
[52] U.S. Cl. .................. 356/375; 250/559.29
[58] Field of Search ..................... 356/373, 374, 356/375; 250/559.29

[56] References Cited

U.S. PATENT DOCUMENTS

| 4,306,220 | 12/1981 | Schwefel et al. . |
| 4,412,206 | 10/1983 | Schwefel . |
| 4,423,958 | 1/1984 | Schmitt .................. 356/375 |

FOREIGN PATENT DOCUMENTS

| 0057368 | 8/1982 | European Pat. Off. . |
| 0352643 | 1/1990 | European Pat. Off. . |
| 27 58 525 | 12/1977 | Germany . |
| 29 38 318 | 3/1981 | Germany . |
| 30 10611 | 9/1981 | Germany . |
| 33 22 897 | 1/1985 | Germany . |
| 37 34 938 | 5/1989 | Germany . |

OTHER PUBLICATIONS

R.L. Schaaf, "Automatically Checked Photoelectric Sensing Apparatus," IBM Technical Disclosure Bulletin, vol. 18, No. 11, pp. 3572-3573. Apr. 1976.

*Primary Examiner*—F. L. Evans
*Attorney, Agent, or Firm*—Brinks Hofer Gilson & Lione

[57] ABSTRACT

The present invention is directed to a position measuring instrument having a testing device for checking the amplitude of the analog scanner signals and for testing the operation of the trigger stages. In a first preferred embodiment the trigger threshold voltage of all the trigger stages is switched simultaneously to defined various test voltages. One test voltage is within the allowable amplitude of the analog scanner signals and a further test voltage is outside. The states of the scanner signals digitized by means of the trigger stages before and after the switchover are compared with one another and as a function thereof an error signal is generated. In another preferred embodiment, the trigger threshold voltage is kept constant and either the radiation intensity of the light source or the intensity of the scanner signal is varied.

21 Claims, 6 Drawing Sheets

POSITION MEASURING INSTRUMENT

FIELD OF THE INVENTION

The invention relates to a position measuring instrument with a scanner for generating analog position-dependent scanner signals which are digitized by means of a trigger stage and more particularly to a testing device for checking the amplitude of the analog scanner signals and for checking the function of the trigger stages.

BACKGROUND OF THE INVENTION

U.S. Pat. No. 4,423,958 which is specifically incorporated herein by reference discloses one such position measuring instrument. For checking the adjustment of the trigger threshold of the trigger stage, a testing device is provided by which the trigger threshold is raised or lowered by the application of a test voltage. By varying the test voltage, various test ranges such as coarse and fine can be selected.

SUMMARY OF THE INVENTION

According to a first aspect of the present invention, a position measuring instrument having a scanning unit for generating position-dependent analog signals is provided. The position-dependent analog signals are each triggered in a trigger stage at a predetermined trigger threshold voltage in order to generate digital scanner signals and to form position measurement values. The position measuring instrument has a testing device coupled to the scanning unit. The testing device includes a switch to apply one of a plurality of test voltages to either the trigger stage to vary the trigger threshold voltage or to the light source to vary the position-dependent analog signals wherein in one state, the trigger threshold voltage is within the amplitude of the position-dependent analog signal, and, in a further state, the trigger threshold voltage is outside the amplitude of the position-dependent analog signal.

An object of the present invention is to provide a position measuring instrument with a testing device in which a failure of the trigger stage can be unequivocally detected.

In the position measuring instrument according to the present invention scanner errors and trigger stage errors can be detected in a simple way. The test voltages required for the testing are preferably predetermined in fixed form which assures a fast testing operation that can be carried out by the position measuring instrument user as well.

The invention itself, together with further objects and attendant advantages, will best be understood by reference to the following detailed description, taken in conjunction with the accompanying drawings.

BRIEF DESCRIPTION OF THE DRAWINGS

FIG. 1a illustrates a portion of a material measure scanned by the measuring instrument shown in FIG. 1.

FIG. 5a illustrates a portion of the material measure scanned by the measurement instrument shown in FIG. 5.

DETAILED DESCRIPTION OF THE PRESENTLY PREFERRED EMBODIMENTS

Figure 1:
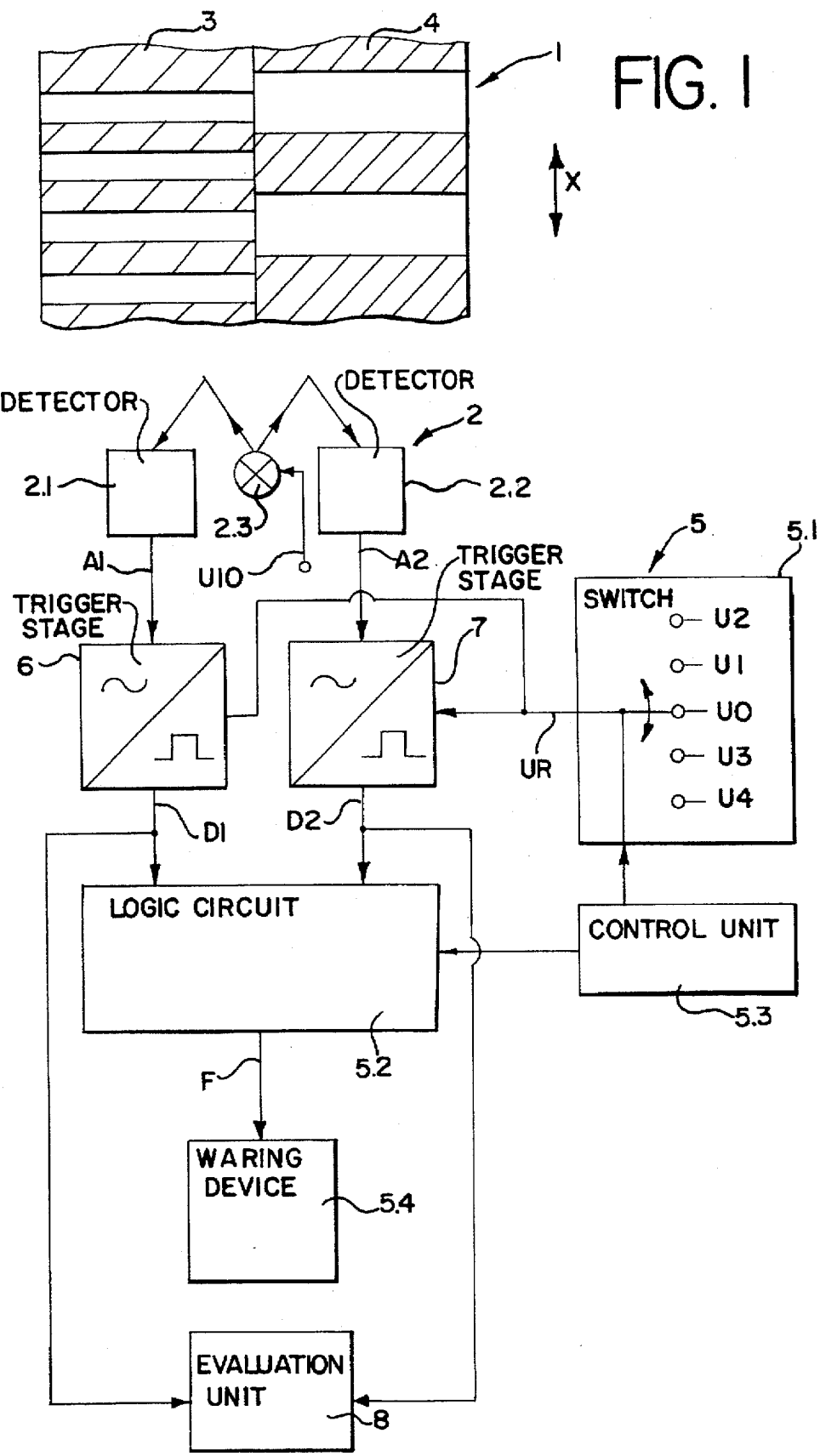
FIG. 1 schematically illustrates an absolute length measuring instrument with a testing device according to a first preferred embodiment of the present invention.

FIG. 1 schematically illustrates an absolute length measuring instrument with a testing device according to a first preferred embodiment of the present invention. FIG. 1a illustrates a portion of a material measure scanned by the measuring instrument shown in FIG. 1. The material measure 1 is displaceable relative to a scanner unit 2 in the measurement direction X. The material measure 1 in a known manner includes a plurality of division tracks 3 and 4 disposed side by side. The measuring instrument includes a light source 2.3, and preferably two detectors 2.1 and 2.2, as shown at least two trigger stages 6 and 7 and a testing device 5. Alternatively, only one detector or multiple detectors may be used. The testing device 5 includes a switch 5.1, logic circuit 5.2, control unit 5.3 and warning device 5.4. The scanner unit 2 also includes an evaluation unit 8. The physical construction of the measuring instrument will be described first followed by a description of its operation.

The detectors 2.1 and 2.2 are coupled to an input of the trigger stages 6 and 7 respectively. The trigger stages 6 and 7 also have an input coupled to the output of the switch 5.1. The outputs of the trigger stages 6 and 7 are coupled to an input of logic circuit 5.2. The outputs of the trigger stages 6 and 7 are also coupled to the evaluation unit 8. The control unit 5.3 has outputs coupled to both the switch 5.1 and the logic circuit 5.2. The output of the logic circuit 5.2 is coupled to the warning device 5.4.

Each division track 3 and 4 comprises alternatingly reflective and nonreflective regions so that the light emitted by a light source 2.3 is modulated and in that form strikes detectors 2.1 and 2.2 of the scanner unit 2. Position-dependent analog electrical scanner signals A1 and A2 respectively are generated at the outputs of the detectors 2.1 and 2.2.

The outputs of detectors 2.1 and 2.2 are sent to trigger stages 6 and 7. Trigger stages 6 and 7 also receive as an input a trigger threshold voltage UR. Each trigger stage 6 and 7 is a comparator which compares the amplitude of the applied scanner signal A1, A2 to the applied trigger threshold voltage UR. If the amplitude of the scanner signal A1 for the inverting trigger stage 6 shown is greater than the amplitude of the trigger threshold voltage UR, then the signal level "logical 0" is output at the output D1 of the trigger stage 6. If A1 is less than UR, the signal level "1" is output. The signal levels of the digitized scanner signal D2 at the output of the trigger stage 7 behave in the same way. The trigger threshold voltage UR is determined by switch 5.1 which according to a preferred embodiment can be selected from U0, U1, U2, U3 and U4. The output D1 and D2 of the trigger stages 6 and 7 respectively are sent to evaluation unit 8 where they are evaluated and an absolute position is determined in a well known manner that need not be described here.

According to a preferred embodiment of the invention, the trigger threshold voltage UR can be varied in five stages via a switch device B.1. As a function of the set trigger threshold voltage UR, the checking of the triggered scanner signals D1, D2 is effected by means of logic circuit 5.2 which will be described hereinafter in further detail. The switch device 5.1 is triggered by control unit B.3 and the synchronization between the switch position 5.1 and the logic circuit 5.2 is also effected via the control unit 5.3. If the logic circuit 5.2 has detected an error state of the scanner unit 2 or of one of the trigger stages 6 and 7, then an error signal F is output to activate the warning device 5.4.

For triggering the analog scanner signals A1, A2 in normal measuring operation, the trigger threshold voltage UR is set to be equal to U0 which is the mean voltage of the analog scanner signals A1 and A2. FIG. 2a illustrates a signal plot of scanning signal A1, where the measuring direction X is on the x axis and the signal voltage is on the y axis. The same coordinate system is set up for FIGS. 2(b)–(e). Setting UR=U0 creates a rectangular signal D1 having the logical levels 0 (low) and 1 (high) according to when the scanning signal A1 is greater than or less than U0 respectively. By scanning a plurality of division tracks 3 and 4, a combination of logical levels is obtained that define the absolute position as a digital word. To preclude mistakes in measurement according to the present invention, checking for the correct function of the scanner unit 2, and in particular of the light source 2.3 and of the trigger stages 6 and 7, is accomplished by applying the testing voltages U1–U4 as trigger threshold voltages UR to each of the trigger stages 6, 7. The resultant signal levels of the triggered scanner signal D1 are shown in FIGS. 2a–2e. In these diagrams, t1 indicates the state at which A1<U0 and hence D1=1, and t2 indicates the state at which A1>U0 and thus D1=0.

FIG. 2b shows the state in which the trigger threshold UR is switched over from U0 to U1. The amplitude of U1 is chosen such that it is within the maximum and minimum allowable amplitude of the scanner signal A1 and is also less than U0. At time t1, A1<U0; in other words, in normal operation upon a shift downward of the trigger threshold UR, D1 must not vary, or must remain at 1 as shown in FIG. 2b. However, if the logical level of the output signal D1 changes from 1 to 0, this is an indication that there is an error in the generation of the scanner signal A1, for example, the light source 2.3 may be defective. The time t2 indicates the state when A1>U0. D1 should not change from the downward shift of the trigger threshold UR. In an error situation, D1 will vary and so an error signal F will be generated.

FIG. 2c shows the testing step in which the trigger threshold UR is switched from U0 to U2. U2 has an amplitude that is outside the allowable amplitude range of the scanner signal A1 during normal operation and is less than U0. During the state t1 in which A1<U0, the trigger stage 6 can be checked since if it is operating correctly the output level D1 of the trigger stage 6 must vary from 1 to 0. If the output level D1 does not change, this is an indication of a defect in the trigger stage 6, and an error signal F is sent to the warning device 5.4. If A1>U0 (state t2), then a coarse test can again be made by shifting the trigger threshold UR downward, and an error signal F is output if D1 varies.

In order to obtain a statement about the correct function of the scanner unit 2 and trigger stage 6 during state t2, in which A1>U0, the trigger threshold UR is also shifted in the positive direction by means of the switch device 5.1. In FIG. 2d, the trigger threshold UR is raised to U3. U3 has an amplitude that is within the maximum and minimum allowable amplitude of the scanner signal A1, but is greater than U0. In the state t2 (A1>U0) of FIG. 2d, it becomes apparent that if the scanner unit 2 is functioning correctly, the output level D1 of the trigger stage 6 must not change. Conversely, if a change in the output signal D1 from 0 to 1 occurs, this is an indication that the amplitude of the analog scanner signal A1 is too low, and an error signal F is generated. If D1 varies in the state t1, then once again an error signal F is generated.

In the last test step shown in FIG. 2e, the trigger threshold UR is switched over from U0 to U4. The amplitude of U4 is outside the allowable amplitude range for the scanner signal A1 and is greater than U0. In the state t1 (A1<U0), an error signal F is output if D1 changes. In the state t2 (A1>U0), the correct function of the trigger stage 6 is tested by checking whether the logical output level D1 of the trigger stage 6 changes. If a change is found, then correct function is guaranteed. If no change in the logic circuit 5.2 is found, then via the error signal F a warning device 5.4 is activated.

The logic circuit 5.2 is organized such that it reliably generates an error signal F in the following cases:

1. If D1=1 when UR=U0, and D1 becomes=0 when UR=U1.
2. If D1=1 when UR=U0, and D1 remains=1 when UR=U2.
3. If D1=0 when UR=U0, and D1 becomes=1 when UR=U3.
4. If D1=0 when UR=U0, and D1 remains=0 when UR=U4.

It is also appropriate for an error signal F to be output in the following cases:

5. If D1=1 when UR=U0 and D1 becomes=0 when UR=U3.
6. If D1=1 when UR=U0 and D1 becomes=0 when UR=U4.
7. If D1=0 when UR=U0 and D1 becomes=1 when UR=U1.
8. If D1=0 when UR=U0 and D1 becomes=1 when UR=U2.

It can be seen that by using two test voltages U1 and U2 less than U0 and two test voltages U3 and U4 greater than U0, the testing is possible at all the unequivocal signal states of the analog scanner signal A1. This has the advantage that the testing can be done in virtually any arbitrary relative position between the scanner unit 2 and the material measure 1. It is especially advantageous if all the trigger stages 6, 7 are checked simultaneously, or in other words if the same test voltage U1, U2, U3, U4 is applied to all the trigger stages 6, 7 at the same time.

From the signal diagram in FIG. 2a it can be seen that the digitized scanner signal D1 in the region around A1=U0 is not unequivocal. It can also be seen that in the range of the rise, the analog scanner signal A1 cannot be checked unequivocally with the test voltages U1 and U3. In the scanning of a plurality of division tracks 3, 4, which form a gray code within a code group, it is assured that this non-unequivocal region cannot occur simultaneously in more than one of the analog scanner signals A1, A2. From the signal levels of the triggered scanner signals D1, D2, it is relatively simple to ascertain the single analog scanner signal A1, A2 in which at the moment there is no unequivocal signal state, and in which the output signal D1 of the trigger stage 6 is allowed to vary upon a shift in the trigger threshold UR from U0 to U1 and from U0 to U3 without generating an error signal F. This will be described below in conjunction with FIG. 3.

Figure 3:
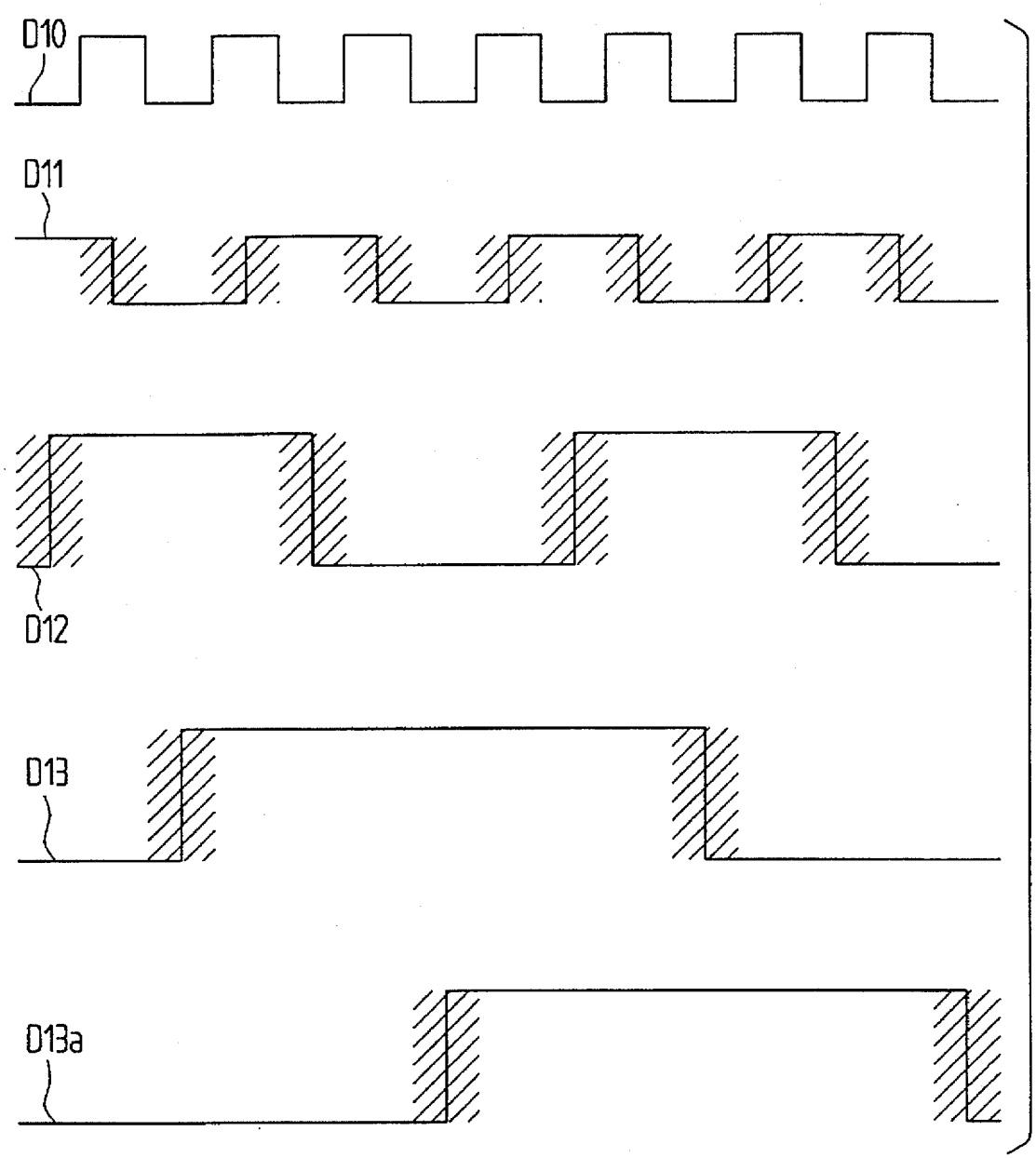
FIG. 3 illustrates further signal diagrams.

In FIG. 3, the digitized scanner signals D10, D11, D12, D13 and D13a, generated by four scanner units, not shown, in measurement operation are shown. These digitized scanner signals are supplied to the evaluation unit 8 for forming the instantaneous position. The scanner signal D10 is derived from the finest division track, which is also called an incremental track. In a known manner, the scanner signal D10 can be supplied to a counter of the evaluation unit 8. Scanner signals D11, D12, D13 and D13a serve to form a digital code word which at any moment determines the absolute position.

The non-unequivocal regions of these scanner signals D11–D13a are shown shaded. They are determined for each scanner signal D11–D13a as a function of the signal levels (0 or 1) of the preceding finer digital scanner signals D10–D12:

1. D11 is not unequivocal, if D10=1
2. D12 is not unequivocal, if D10=0 and D11=1
3. D13 is not unequivocal, if D10=0 and D11=0 and D12=1
4. D13a is not unequivocal, if D10=0 and D11=0 and D12=0

In other words, the following is generally true, the scanner signal D1n is not unequivocal and thus is not checked, or in other words no error signal F is sent to the warning device 5.4, if the following conditions are satisfied:

$$D1k=1, \text{ where } k=(n-1), \text{ for } n \geq 1,$$

and $$D1k=0, \text{ where } k=0 \text{ through } (n-2), \text{ for } n \geq 2.$$

The scanner signal D1na with the same period length as the scanner signal D1n, but phase offset by 90°, is not unequivocal and thus is also not checked, if the following condition is satisfied:

$$D1k=0, \text{ where } k=0 \text{ through } (n-1), \text{ for } n \geq 1.$$

The triggered scanner signal D13a shown in FIG. 3 is used in absolute position measuring systems, especially in angle encoders with a plurality of code disks, joined to one another via gears, for synchronization between two code groups. This synchronization between two code groups of different resolution is described by way of example in U.S. Pat. Nos. 4,306,220 and 4,412,206, which are specifically incorporated herein and German Patents Publication Nos. DE 33 22 897 C2 and DE 37 34 938 C2.

Figure 4:
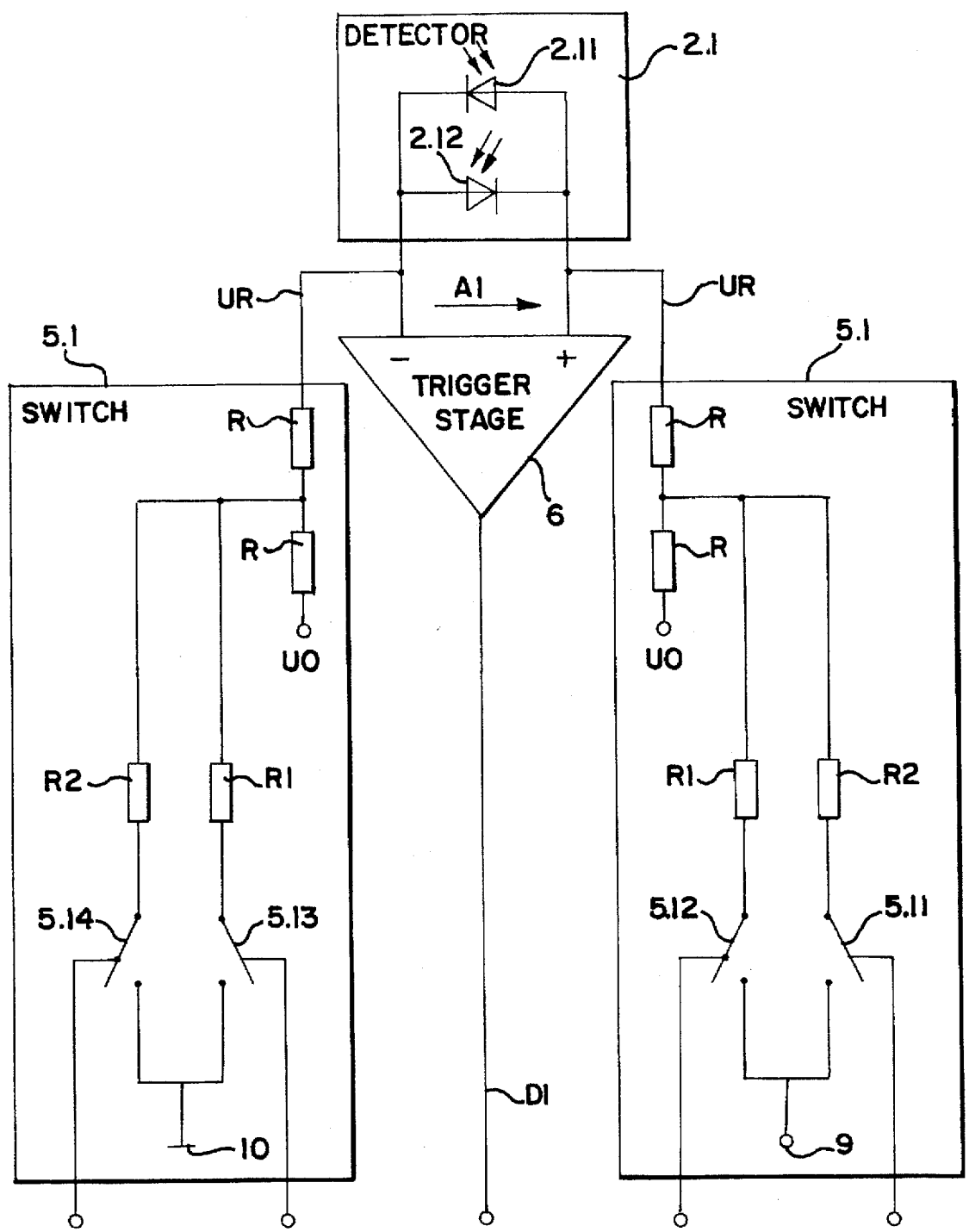
FIG. 4 illustrates in detail a portion of the absolute length measuring instrument shown in FIG. 1 according to a preferred embodiment of the present invention.

The invention has been described in detail with reference to the main circuit diagram of FIG. 1. FIG. 4 illustrates a portion of the absolute length measuring instrument shown in FIG. 1 according to a preferred embodiment of the present invention. The detector 2.1 generates an analog scanner signal A1 in the form of a voltage applied to the two inputs of the trigger stage 6. The detector 2.1 includes a parallel circuit formed by two photoelectric elements 2.11 and 2.12 which are connected in an antiparallel manner. To vary the trigger threshold voltage UR at the inputs of the trigger stage 6, the switch device 5.1 is split into a right-hand and a left-hand part. Each part includes two switches 5.11, 5.12 and 5.13, 5.14, respectively, all of which are open in normal measuring operation so that the trigger threshold U0 is present at each of the inputs of the trigger stage 6. For testing according to the present invention, the switches 5.11–5.14 are closed one after the other, so that with the switch 5.11 closed, the trigger threshold UR is raised from U0 to U4 since a connection is made between the positive (+) input of the trigger stage 6 and a voltage source 9. With the switch 5.12 closed, the trigger threshold is raised from U0 to U3. With the switch 5.13 closed, the trigger threshold is lowered from U0 to U1 because a connection is made between the inverting input (−) of the trigger stage 6 and ground 10. A further lowering of the trigger threshold from U0 to U2 is effected by closing the switch 5.14.

Figure 2:
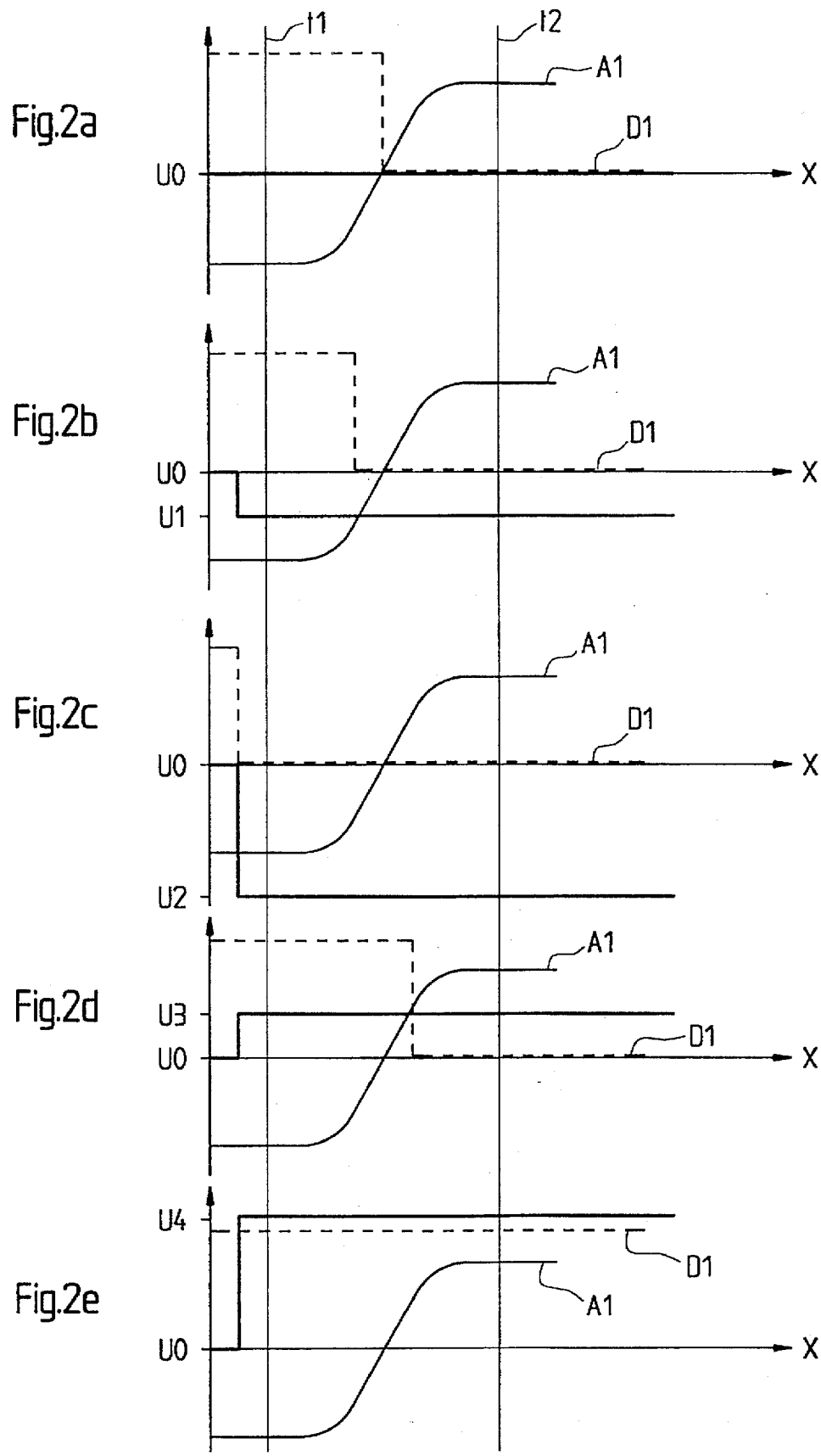
FIGS. 2a–2e illustrate signal diagrams of the outputs of the detectors, trigger stages and trigger threshold voltage of the measuring instrument shown in FIG. 1.

The resistors R and R1 and R2 form voltage dividers and are chosen such that the trigger thresholds U1, U2, U3, U4 have the magnitudes discussed in conjunction with FIG. 2 relative to the analog scanner signal A1.

The triggering of the switches 5.11 through 5.14 is effected by means of the control unit 5.3 shown in FIG. 1.

Alternatively, instead of switching to predetermined trigger threshold voltages U1–U4, it is also possible according to the present invention to make an infinitely graduated shift, for example, in the trigger threshold voltage UR. Upon this shift, checking is done to find out what the trigger threshold voltage UR is when the state of the triggered scanner signal D1 changes. The magnitude of the trigger threshold voltage UR upon a change in the state defines the instantaneous amplitude of the scanner signal A1, from which a failure of the light source 2.3, for instance, can be detected in good time.

The present invention is not limited to the photoelectric length measuring instrument described. More particularly, it may be used in an absolute angle measuring device in which a plurality of code disks are coupled to one another via step-down gears. The present invention can also be used in magnetic, inductive and capacitive position measuring instruments. In magnetic position measuring instruments, the scanner signals A1, A2 are generated by magnetoresistive elements or by Hall elements.

The test voltages U0–U4 for generating the trigger threshold UR are perfectly generated within the position measuring instrument, however, it is also possible to supply them to the position measuring instrument from an external device.

Figure 5:
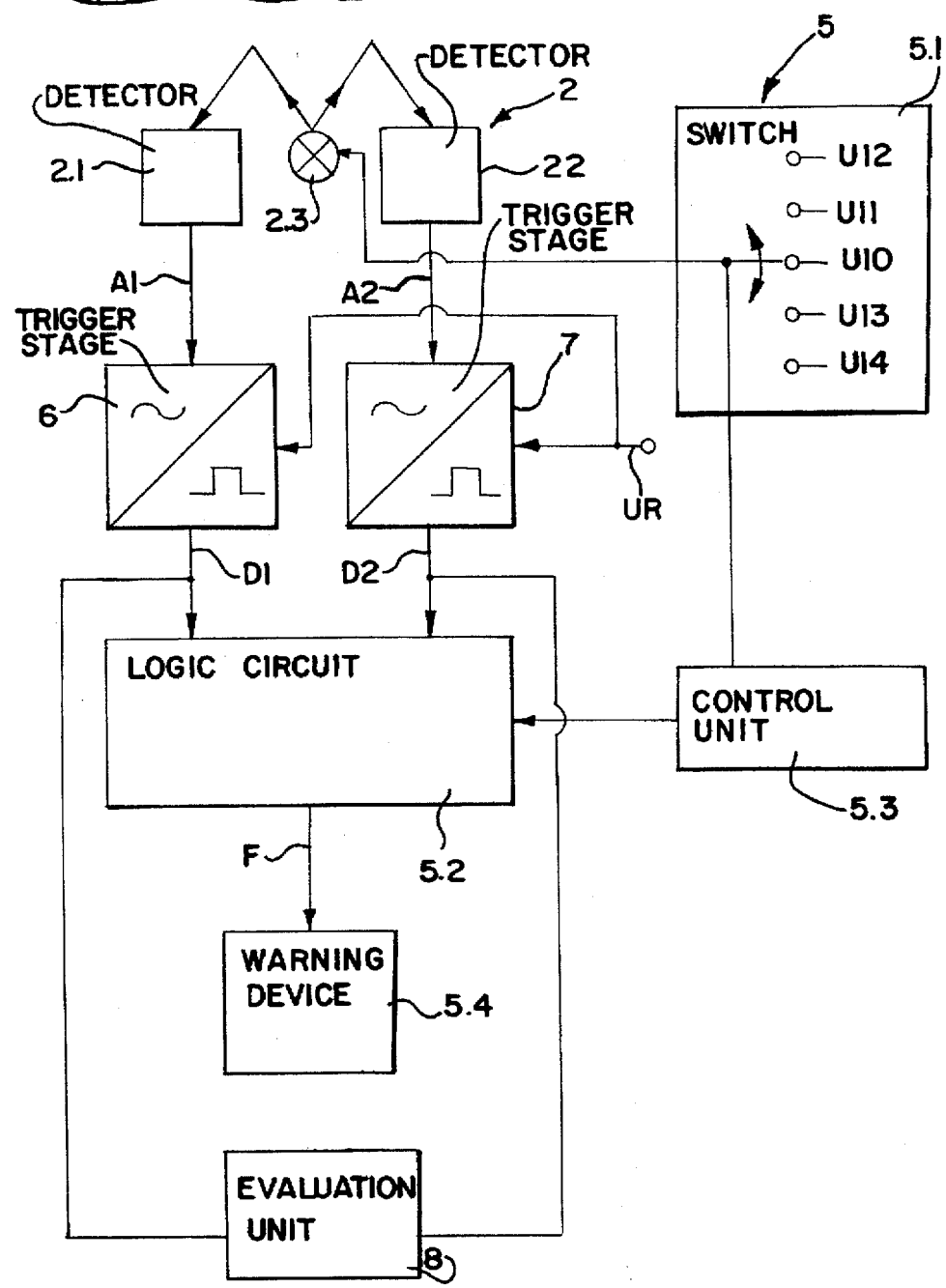
FIG. 5 is a schematic view of an absolute length measuring instrument with a testing device according to a second preferred embodiment of the present invention.

In the preferred embodiments discussed, the light source 2.3 is operated at constant intensity during the entire testing operation. This is attained by operating the light source 2.3 at constant voltage U10. It can be seen from FIGS. 2a–2e that with the testing device 5, the location of the trigger threshold voltage UR relative to the scanner signal A1 is selectable and such a selection can be made particularly simply. The same effect, however, can be obtained by keeping the trigger threshold voltage UR constant at U0 and varying the scanner signal. This variation can be done by superimposing the test voltages U0–U4 directly on the scanner signal A1 or by varying the intensity of the light source 2.3. FIG. 5 is a schematic view of an absolute length measuring instrument according to a second preferred embodiment in which such a variation is obtained. The testing device 5 according to this preferred embodiment varies the radiation intensity of the light source by varying the operating voltage U10, U11, U12, U13 and U14. The trigger threshold voltage UR, conversely, remains constant at UR=U0. In a preferred embodiment, the operating voltages may have the following values, U14=0 volts, U13=3 volts, U10=4 volts, U11=8 volts and U12=16 volts, for example.

FIGS. 6a–6e illustrate the signal diagrams of the measurement instrument shown in FIG. 5. A1 designates the scanner signal that is output from detector 2.1 during the relative motion between the material measure shown in FIG. 5a and the scanner unit 2.

Figure 6A:
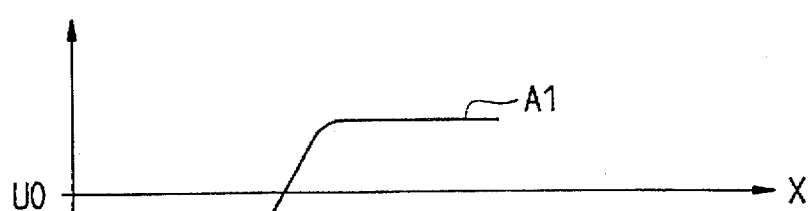
FIG. 6a–6e illustrate signal diagrams of the outputs of the detectors and trigger threshold voltage of the measuring instrument shown in FIG. 5.
Figure 6B:
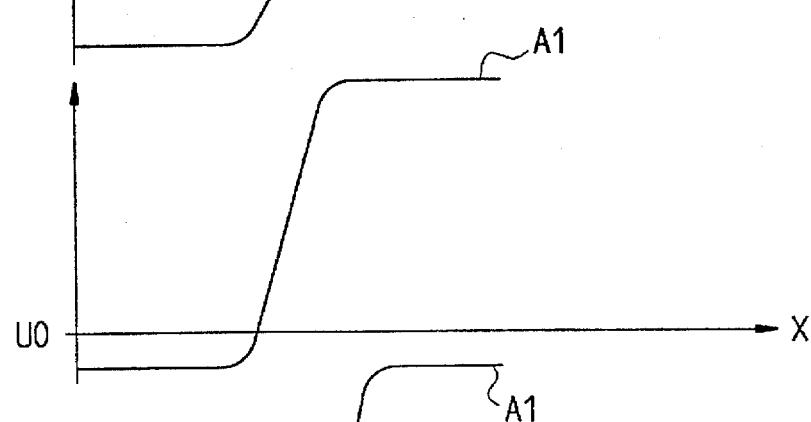
Figure 6C:
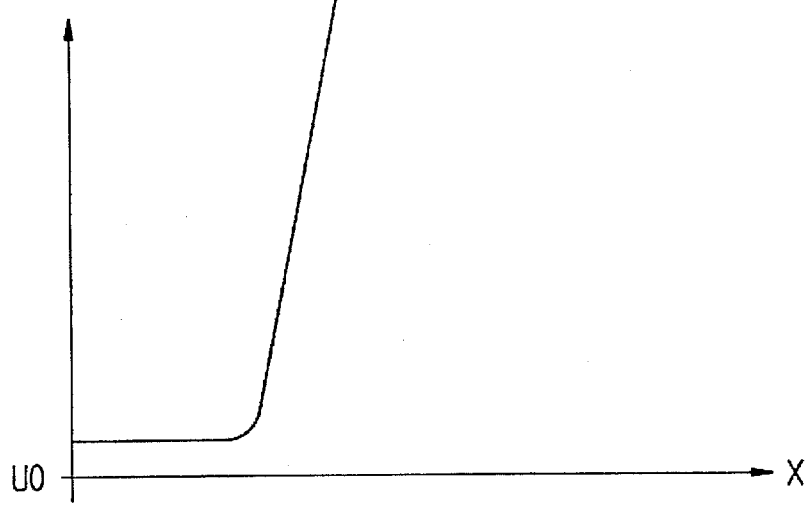
Figure 6D:
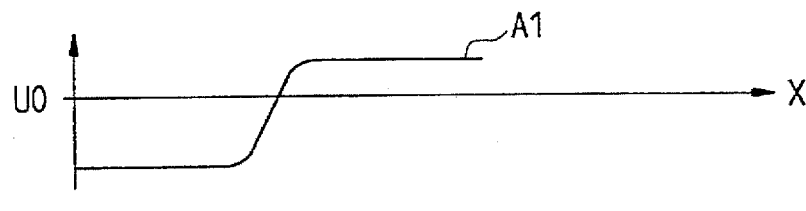

FIG. 6a illustrates the signal diagrams during normal operation with the operating voltage of the light source 2.3 being operated at U10=4 volts. In FIG. 6b a first testing state is illustrated in which the operating voltage of the light source is equal to U11=8 volts. The status of the triggered signal D1 must not vary compared with the normal operation, otherwise an error signal will be produced. FIG. 6c illustrates the signal diagrams during another testing stage in which the operating voltage of the light source 2.3 is equal to U12=16 volts. In this testing stage, the entire scanner signal A1 is raised above the trigger threshold voltage U0. If trigger stage 6 is operating properly, the triggered scanner signal D1 assumes the state of 1. In FIG. 6d, a third testing state is illustrated in which the operating voltage of the light source is equal to U13=3 volts. Once again, the status of the triggered scanner signal D1 must not change compared during normal operation.

Figure 6E:
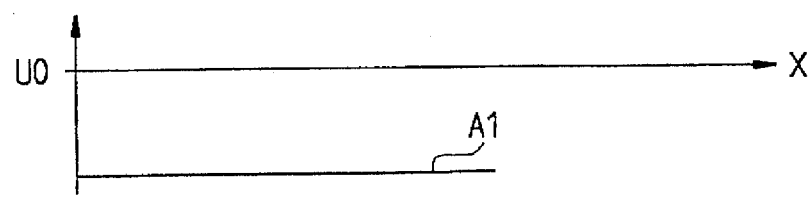

In FIG. 6e, a fourth testing state is shown in which the operating voltage of the light source is equal to U14=0 volts. During this testing state, the scanner signal A1 is lowered below the trigger threshold voltage U0. If the trigger stage 6 is operating properly, the triggered scanner signal D1 assumes the state of 0.

Alternatively, with position measurement instruments operating on the magnetic scanning principle, the intensity of the scanner signal can be varied purposefully relative to the trigger threshold voltage by applying a variable magnetic field, for instance with a coil. The signal intensity could also be varied by changing the spacing between the material measure and the scanner unit.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A position measuring instrument having a scanning unit for generating position-dependent analog signals that are each triggered in a trigger stage at a predetermined trigger threshold voltage in order to generate digital scanner signals and to form position measurement values, the position measuring instrument having a light source and a testing device coupled to the scanning unit, the testing device comprising:

a switch coupled to either the light source or an input of the trigger stage; and an evaluation unit coupled to an output of the trigger stage wherein the switch generates a plurality of test voltages and applies one of the plurality of test voltages to either the trigger stage to vary the trigger threshold voltage or to the light source to vary the position-dependent analog signals wherein in one state, the test voltage is within an allowable amplitude in normal operation of the position-dependent analog signal, and, in a further state, the test voltage is outside the allowable amplitude in normal operation of the position-dependent analog signal and further comprising a logic circuit coupled to the output of the trigger stage for monitoring the digital state of the test voltage and the digital state of the digital scanner signal, the logic circuit generating an error signal as a function of a change of the digital state under prescribed conditions.

2. The position measuring instrument according to claim 1 wherein the scanner unit has a parallel circuit of two photoelectric elements which are connected antiparallel to one another, wherein the position-dependent analog signal is present in the form of a differential voltage of the two photoelectric elements at two inputs of a trigger stage, and the test voltage is supplied by the testing device via at least one of two inputs of the trigger stage.

3. The position measuring instrument according to claim 1 wherein the scanner unit has a material measure with a plurality of division tracks for generating a plurality of position-dependent analog signals, wherein the division tracks form a gray code.

4. The position measuring instrument according to claim 1 further comprising a plurality of trigger stages for forming a plurality of digital scanner signals wherein the same test voltage is applied to the plurality of trigger stages simultaneously.

5. The position measuring instrument according to claim 1 wherein when one of the position-dependent analog signals is tested, the outputting of an error signal to a warning device occurs as a function of the states of further digital scanner signals.

6. The position measuring instrument according to claim 5 wherein the testing of a position-dependent analog signal of an nth division track, no error signal is output if the following conditions are satisfied:

$D1k=1$, where $k=(n-1)$, for value of $n \geq 1$, and $D1k=0$, where $k=0$ to $(n-2)$ for values of $n \geq 2$, where n designates successive division tracks, and where the higher value of n, indicates a greater division period of the nth division track.

7. The position measuring instrument according to claim 1 wherein by means of the testing device, the trigger threshold voltage is switched over from a mean voltage to one of four test voltages, wherein two test voltages are within the allowable amplitude in normal operation of the analog scanner signal, one of the test voltages being lower and the other higher than the mean voltage, and that two test voltages are also outside the allowable amplitude in normal operation of the analog scanner signal, one of these test voltages being lower and the other higher than the mean voltage.

8. The position measuring instrument according to claim 7 wherein an error signal is generated by the testing device if the state of the digital scanner signal changes upon the switchover from one to the other of the two test voltages that are located within the allowable amplitude in normal operation of the analog scanner signal.

9. The position measuring instrument according to claim 8 wherein upon the switchover to a test voltage outside the amplitude allowable in normal operation and in the direction of the instantaneous amplitude of the analog scanner signal, an error signal is generated if the state of the digital scanner signal does not vary.

10. The position measuring instrument according to claim 1 wherein the analog scanner signal is varied by the application of a plurality of test voltages to a light source of the scanner unit.

11. A position measuring instrument having a scanning unit for generating position-dependent analog signals that are triggered in a trigger stage at a predetermined trigger threshold voltage in order to generate digital scanner signals and to form position measurement values, the position measuring instrument having a testing device coupled to the scanning unit, the testing device comprising:

means for varying either one of the trigger threshold voltage or the analog scanner signal so that in one state the trigger threshold voltage is within the allowable amplitude in normal operation of the analog scanner signal and in a further state the trigger threshold voltage is outside the allowable amplitude in normal operation of the analog scanner signal; further comprising a logic circuit coupled to the output of the trigger stage for monitoring the digital state of the output of the trigger stage, the logic circuit generating an error signal as a function of a change of the digital state under prescribed conditions.

12. The position measuring instrument according to claim 11 wherein the scanner unit has a material measure with a plurality of division tracks for generating a plurality of position-dependent analog signals, wherein the division tracks form a gray code.

13. The position measuring instrument according to claim 11 further comprising a plurality of trigger stages for forming a plurality of digital scanner signals wherein the same test voltage is applied to the plurality of trigger stages simultaneously.

14. The position measuring instrument according to claim 11 wherein when one of the position-dependent analog signals is tested, the outputting of an error signal to a warning device occurs as a function of the states of further digital scanner signals.

15. The position measuring instrument according to claim 11 wherein the testing of a position-dependent analog signal of an nth division track, no error signal is output if the following conditions are satisfied:

$$D1k=1, \text{ where } k=(n-1), \text{ for value of } n \geq 1,$$

and $$D1k=0, \text{ where } k=0 \text{ to } (n-2) \text{ for values of } n \geq 2,$$

where n designates successive division tracks, and where the higher value of n, indicates a greater division period of the nth division track.

16. The position measuring instrument according to claim 1 wherein by means of the testing device, the trigger threshold voltage is switched over from a mean voltage to one of four test voltages, wherein two test voltages are within the allowable amplitude in normal operation of the analog scanner signal, one of the test voltages being lower and the other higher than the mean voltage, and that two test voltages are also outside the allowable amplitude in normal operation of the analog scanner signal, one of these test voltages being lower and the other higher than the mean voltage.

17. The position measuring instrument according to claim 16 wherein an error signal is generated by the testing device if the state of the digital scanner signal changes upon the switchover from one to the other of the two test voltages that are located within the allowable amplitude in normal operation of the analog scanner signal.

18. The position measuring instrument according to claim 17 wherein upon the switchover to a test voltage outside the amplitude allowable in normal operation and in the direction of the instantaneous amplitude of the analog scanner signal, an error signal is generated if the state of the digital scanner signal does not vary.

19. The position measuring instrument according to claim 11 wherein the analog scanner signal is varied by the application of a plurality of test voltages to a light source of the scanner unit.

20. A position measuring instrument having a scanning unit and a scale with a plurality of division tracks for generating a plurality of position-dependent analog signals that are triggered in trigger stages at a predetermined trigger threshold voltage in order to generate digital scanner signals and to form position measurement values in an evaluation unit, the position measuring instrument having a testing device coupled to the scanning unit, the testing device comprising:

means for varying either one of the trigger threshold voltage or the analog scanner signal of one of the trigger stages so that in one state the trigger threshold voltage is within the allowable amplitude in normal operation of the analog scanner signal and in a further state the trigger threshold voltage is outside the allowable amplitude in normal operation of the analog scanner signal; further comprising a logic circuit coupled to the output of the one trigger state for monitoring the digital state of the output of this trigger stage, the logic circuit generating an error signal as a function of a change of the digital state under prescribed conditions and when the analog scanner signal of the one trigger stage is tested, the generating of an error signal occurs as a function of the states of further digital scanner signals.

21. The position measuring instrument according to claim 20 wherein the testing of a position-dependent analog signal of an nth division track, no error signal is output if the following conditions are satisfied:

$$D1k=1, \text{ where } k=(n-1), \text{ for value of } n \geq 1,$$

and $$D1k=0, \text{ where } k=0 \text{ to } (n-2) \text{ for values of } n \geq 2,$$

where n designates successive division tracks, and where the higher value of n, indicates a greater division period of the nth division track.

* * * * *

UNITED STATES PATENT AND TRADEMARK OFFICE
CERTIFICATE OF CORRECTION

PATENT NO. : 5,691,814
DATED : November 25, 1997
INVENTOR(S) : Erich Strasser

It is certified that error appears in the above-identified patent and that said Letters Patent is hereby corrected as shown below:

<u>In the Claims</u>

Claim 16, line 2, change "1" to --11--.

Signed and Sealed this

Fourth Day of April, 2000

Attest:

Q. TODD DICKINSON

Attesting Officer　　　　　　　Director of Patents and Trademarks